(12) United States Patent
Fang

(10) Patent No.: US 7,684,198 B2
(45) Date of Patent: Mar. 23, 2010

(54) STACKED HEAT-TRANSFER INTERFACE STRUCTURE

(75) Inventor: Chih-Liang Fang, Hsintien (TW)

(73) Assignee: Adlink Technology Inc., Taipei (TW)

( * ) Notice: Subject to any disclaimer, the term of this patent is extended or adjusted under 35 U.S.C. 154(b) by 0 days.

(21) Appl. No.: 12/212,654

(22) Filed: Sep. 18, 2008

(65) Prior Publication Data
US 2009/0021918 A1    Jan. 22, 2009

Related U.S. Application Data

(63) Continuation-in-part of application No. 11/469,478, filed on Aug. 31, 2006, now abandoned.

(51) Int. Cl.
   *H05K 7/20*    (2006.01)
(52) U.S. Cl. ............... 361/719; 361/690; 361/704; 257/718; 257/719; 165/185
(58) Field of Classification Search ......... 361/703–705, 361/715–720; 257/712, 718, 719, 727; 165/80.3, 165/185
See application file for complete search history.

(56) References Cited

U.S. PATENT DOCUMENTS

| | | | | |
|---|---|---|---|---|
| 5,901,039 A | * | 5/1999 | Dehaine et al. | 361/704 |
| 6,091,603 A | * | 7/2000 | Daves et al. | 361/704 |
| 6,166,908 A | * | 12/2000 | Samaras et al. | 361/700 |
| 6,444,496 B1 | * | 9/2002 | Edwards et al. | 438/122 |
| 6,665,187 B1 | * | 12/2003 | Alcoe et al. | 361/719 |
| 6,706,562 B2 | * | 3/2004 | Mahajan et al. | 438/125 |
| 6,707,671 B2 | * | 3/2004 | Yamashita et al. | 361/704 |
| 6,826,054 B2 | * | 11/2004 | Liu | 361/719 |
| 6,837,306 B2 | * | 1/2005 | Houle et al. | 165/185 |
| 6,956,739 B2 | * | 10/2005 | Bunyan | 361/700 |
| 6,982,877 B2 | * | 1/2006 | Vinson et al. | 361/719 |
| 7,031,162 B2 | * | 4/2006 | Arvelo et al. | 361/718 |

* cited by examiner

*Primary Examiner*—Boris L Chervinsky

(57) ABSTRACT

A stacked heat-transfer interface structure for dissipating heat from a circuit board is disclosed to include a heat plate affixed to the circuit board, and relatively thinner first heat transfer devices and relatively thicker second heat transfer devices respectively attached to first and second heat generating electronic devices of the circuit board that have different heights for transferring heat from the first and second heat generating electronic devices of the circuit board to the heat plate for dissipation. Each first heat transfer device comprises a first heat-transfer sheet member having a high heat conductivity and a low thermal resistance and bonded to one first heat generating electronic device, an elastically deformable second heat-transfer sheet member having a low heat conductivity and a high thermal resistance and bonded to the heat plate to compensate for height tolerance of the respective first heat generating electronic device, and a heat-transfer block for spreading heat energy from the first heat-transfer sheet member onto the heat plate through the second heat-transfer sheet member.

13 Claims, 4 Drawing Sheets

US 7,684,198 B2

STACKED HEAT-TRANSFER INTERFACE STRUCTURE

This application is a Continuation-In-Part of my patent application Ser. No. 11/469,478, filed on Aug. 31, 2006.

BACKGROUND OF THE INVENTION

1. Field of the Invention

The present invention relates to cooler modules and more particularly, to a stacked heat-transfer interface structure, which has first and second heat transfer devices thereof respectively attached to first and second heat generating electronic devices of a circuit board to compensate for height differences and to effectively and evenly transfer heat energy from the first and second heat generating electronic devices to a heat plate for quick dissipation.

2. Description of the Related Art

Advanced electronic devices commonly have a high-density design and light, thin, short and small characteristics. These electronic devices require much power and generate much heat during working. In order to effectively dissipate heat energy from multiple heat generating electronic devices, high-performance heat sinks shall be used. A high-performance heat sink has a broad base area and a relatively larger heat-dissipation surface area. Changing the length, height, thickness and pitch of radiation fins may relatively improve the heat dissipation performance of the heat sink. Further, the mounting stability between the heat sink and the circuit board also affects heat dissipation efficiency. Further, a circuit board (motherboard) for industrial computer has installed therein different heat generating electronic devices for different purposes. Different types of heat generating electronic devices have different operational functions, different thicknesses, different heights, and different dimensions. Because the heat generating electronic devices of a circuit board for industrial computer show elevational differences, it is complicated to select and install heat sinks in a circuit board for industrial computer and to keep the installed heat sinks in positive contact with the respective heat generating electronic devices of the circuit board.

Further, a heat sink for printed circuit board is directly attached to the heat generating electronic device or dices so that heat energy can be quickly distributed through the heat sink and then carried away from the heat sink to the outside open air through heat pipe means or by means of forced convection, achieving dissipation of heat. However, regular heat sinks commonly have a flat contact surface without any protrusion or protruded fastening means so that the flat contact surface can be closely attached to heat generating electronic devices. Further, regular heat sinks are commonly extruded from aluminum, copper, or their alloy. When bonding a heat sink to a circuit board, a tin solder or the like shall be used. This installation procedure is complicated and costs a lot. Further, after bonding of a heat sink to a circuit board, the flat contact surface of the heat sink may be not positively kept in close contact with all heat generating electronic devices or contact spots, resulting in low dissipation efficiency and production of a thermal resistance. If a thick, deformable, heat-transfer plate of low heat-transfer coefficient is used, it can be kept in close contact with heat generating electronic devices of different heights. However, a heat-transfer plate of this design has a low thermal conductivity, resulting in low dissipation efficiency.

In general, when a conventional heat sink is installed in a circuit board to dissipate heat from heat generating electronic devices of the circuit board, the heat sink may be not closely attached to all the contact surfaces of the heat generating electronic devices, and any gap produced in between the heat transfer surface of the heat sink and the heat generating electronic devices affects spreading of heat energy from the heat generating electronic devices through the heat sink, lowering the heat dissipation efficiency.

Therefore, it is desirable to provide heat dissipation means that eliminates the aforesaid problems.

SUMMARY OF THE INVENTION

The present invention has been accomplished under the circumstances in view. It is one object of the present invention to provide a stacked heat heat-transfer interface structure, which is positively attachable to heat generating electronic devices of a circuit board that have different heights to compensate for height differences and to effectively transfer heat energy from the heat generating electronic devices to a heat plate for quick dissipation.

According to one aspect of the present invention, the stacked heat-transfer interface structure comprises a heat plate affixed to the circuit board, and relatively thinner first heat transfer devices and relatively thicker second heat transfer devices respectively attached to different heights of first and second heat generating electronic devices of the circuit board for transferring heat from the first and second heat generating electronic devices of the circuit board to the heat plate for dissipation. Each first heat transfer device comprises a first heat-transfer sheet member having a high heat conductivity and a low thermal resistance and bonded to one first heat generating electronic device, an elastically deformable second heat-transfer sheet member having a low heat conductivity and a high thermal resistance and bonded to the heat plate to compensate for height tolerance of the respective first heat generating electronic device, and a heat-transfer block for spreading heat energy from the first heat-transfer sheet member onto the heat plate through the second heat-transfer sheet member.

According to another aspect of the present invention, the second heat-transfer sheet members of the first heat transfer devices are elastically deformable so that the second heat-transfer sheet members are differently deformed to compensate for the height tolerance of the first heat generating electronic devices of the circuit board when the heat plate and the circuit board are fastened together, avoiding stress damage to the first heat generating electronic devices of the circuit board.

According to still another aspect of the present invention, the heat plate has a plurality of mounting holes, the circuit board has a plurality of mounting holes respectively fastened to the mounting holes of the heat plate by fastening members, and elastic members are respectively sleeved onto the fastening members and stopped between the heat plate and the circuit board to absorb shocks and to buffer the pressure between the heat plate and the circuit board, and therefore the heat plate can be smoothly attached to the surface of an external metal shell when assembled with the circuit board.

According to still another aspect of the present invention, a full range of sizes of the second heat transfer devices are provided for selection so that different stacked heat heat-transfer interface structures can easily be assembled to fit different circuit boards having different heights of first and second heat generating electronic devices. By means of modularized fabrication, the invention saves material preparation and facilitates the assembly of the desired stacked heat heat-transfer interface structure.

DETAILED DESCRIPTION OF THE PREFERRED EMBODIMENT

For easy understanding of the features of the present invention, we briefly explain the materials used for regular heat transfer devices and their physical properties. The heat transfer effect of a heat transfer device, such as heat sink or heat plate, is determined subject to the heat conductivity of the heat sink or heat plate. The higher the heat conductivity is, the higher the heat transfer effect will be. On the contrary, if the heat transfer device has a low heat conductivity, the heat transfer effect of the heat transfer device will be poor. However, a heat transfer of relatively higher heat conductivity has a relatively lower thermal resistance and lower wall thickness, therefore a heat transfer device having a relatively higher heat conductivity is less elastic when compared to a heat transfer device having a relatively lower heat conductivity.

Figure 1:
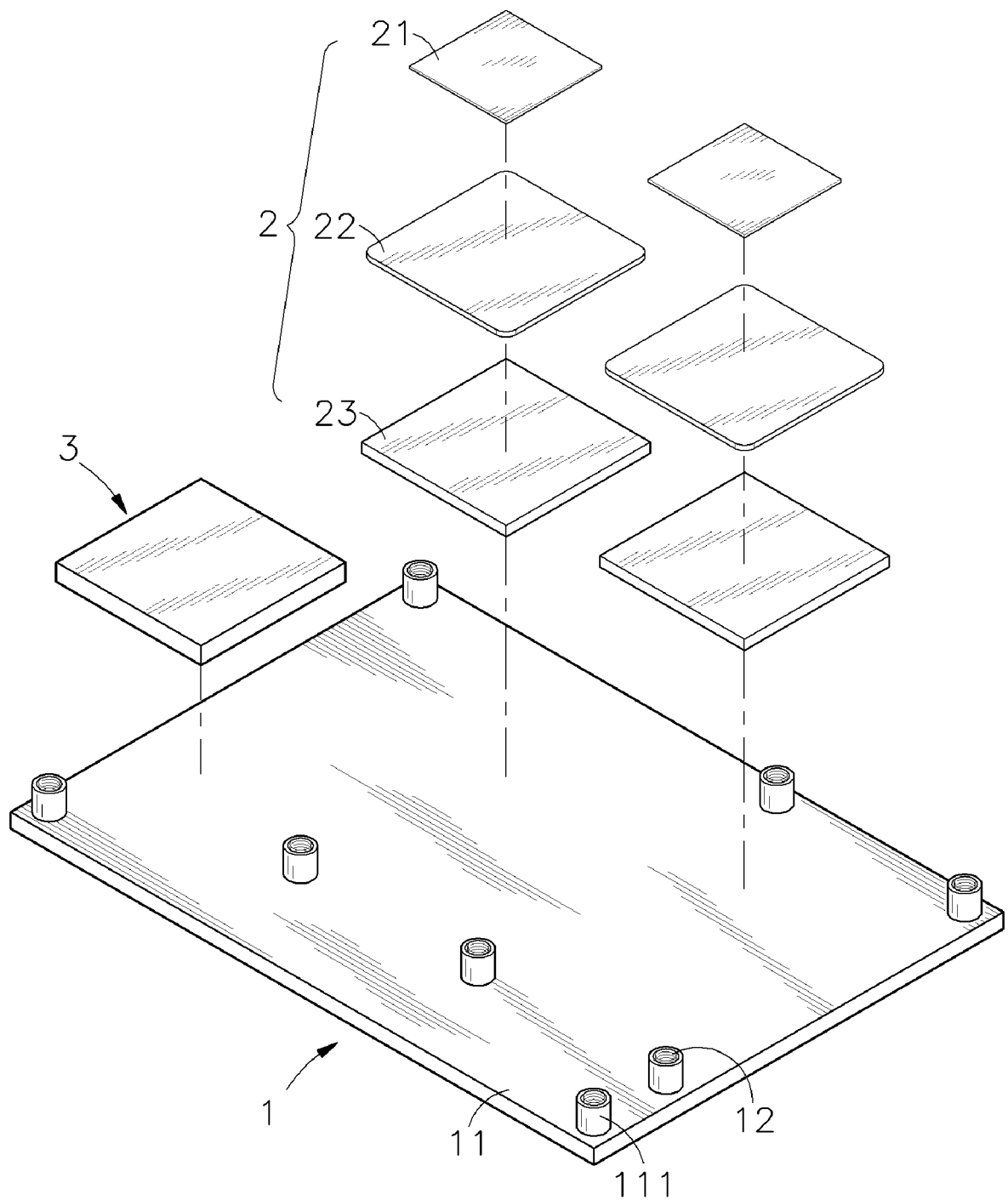
FIG. 1 is an exploded view of a stacked heat-transfer interface in accordance with the present invention.
Figure 2:
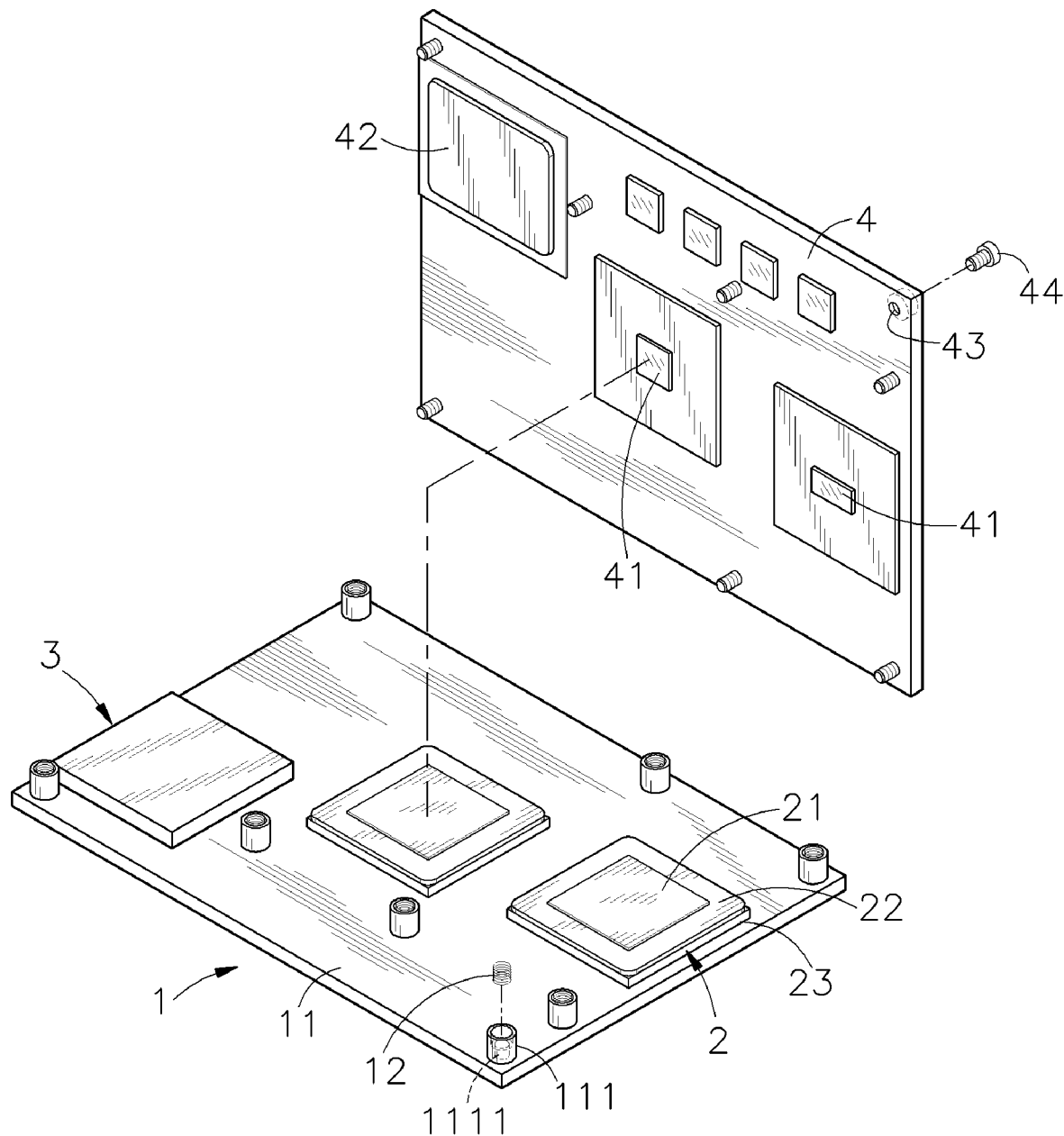
FIG. 2 illustrates the outer appearance of the stacked heat-transfer interface and the relationship between the stacked heat-transfer interface and heat generating electronic devices of a circuit board according to the present invention.

Referring to FIGS. 1 and 2, a stacked heat-transfer interface structure in accordance with the present invention is shown comprising a heat dissipation module 1 adapted for dissipating heat from a circuit board 4.

The heat dissipation module 1 comprises a heat plate 11, a plurality of first heat transfer devices 2, and a second heat transfer device 3.

The heat plate 11 is made of aluminum, copper or any metal alloy capable of spreading heat energy evenly in horizontal and vertical directions. The heat plate 11 has a plurality of mounting holes 111. Each mounting hole 111 has spiral fastening means 1111 (for example, inner thread). Further, an elastic member (for example, coil spring) 12 is mounted in each mounting hole 111 above the respective spiral fastening means 1111.

The first heat transfer devices 2 are stacked devices mounted on the surface of the heat plate 11, each comprising a first heat-transfer sheet member 21 disposed at the top side, a second heat-transfer sheet member 23 disposed at the bottom side, and a heat-transfer block 22 sandwiched between the first heat-transfer sheet member 21 and the second heat-transfer sheet member 23. The first heat-transfer sheet member 21 is made of a material having a high heat conductivity and a low thermal resistance and a vertical heat transfer characteristic. The first heat-transfer sheet member 21 preferably has a thickness about 0.2~0.3 mm, heat conductivity 10~18 w/mk (watt per meter Kelvin). The heat-transfer block 22 has a top surface for the bonding of the first heat-transfer sheet member 21. The surface area of the top surface (cross sectional area) of the heat-transfer block 22 is greater than the first heat-transfer sheet member 21. The heat-transfer block 22 can be made of aluminum, copper, or any suitable metal alloy, having horizontal and vertical heat transfer characteristics for even distribution of heat energy. The second heat-transfer sheet member 23 is bonded to the bottom surface of the heat-transfer block 22, and made of an elastic material having a low heat conductivity and a high thermal resistance and a vertical heat transfer characteristic. The surface area of the second heat-transfer sheet member 23 is equal to the surface area of the bottom surface of the heat-transfer block 22. Further, the second heat-transfer sheet member 23 has a thickness about 0.8~4 mm, and a heat conductivity 1~6 w/mk.

The second heat transfer device 3 is mounted on the surface of the heat plate 11 of the heat dissipation module 1, having a thickness greater than the first heat transfer devices 2.

The circuit board 4 comprises a plurality of first heat generating electronic devices 41, a second heat generating electronic device 42, a plurality of mounting holes 43, and a plurality of fastening members 44. After bonding of the first heat transfer devices 2 and the second heat transfer devices 3 to the first generating electronic devices 41 and the second heat generating electronic device 42 respectively, the fastening members 44 are respectively inserted through the mounting holes 43 and the elastic members 12 in the respective mounting holes 111 of the heat plate 11 and fastened up with the respective spiral fastening means 1111. Further, the mounting holes 111 can be formed of an elastic material that buffers the pressure during connection between the heat dissipation module 1 and the circuit board 4, avoiding uneven load. Therefore, when installing the stacked heat-transfer interface in a metal case for electronic apparatus, the heat plate 11 can be smoothly attached to the inside surface of the metal case.

Figure 3:
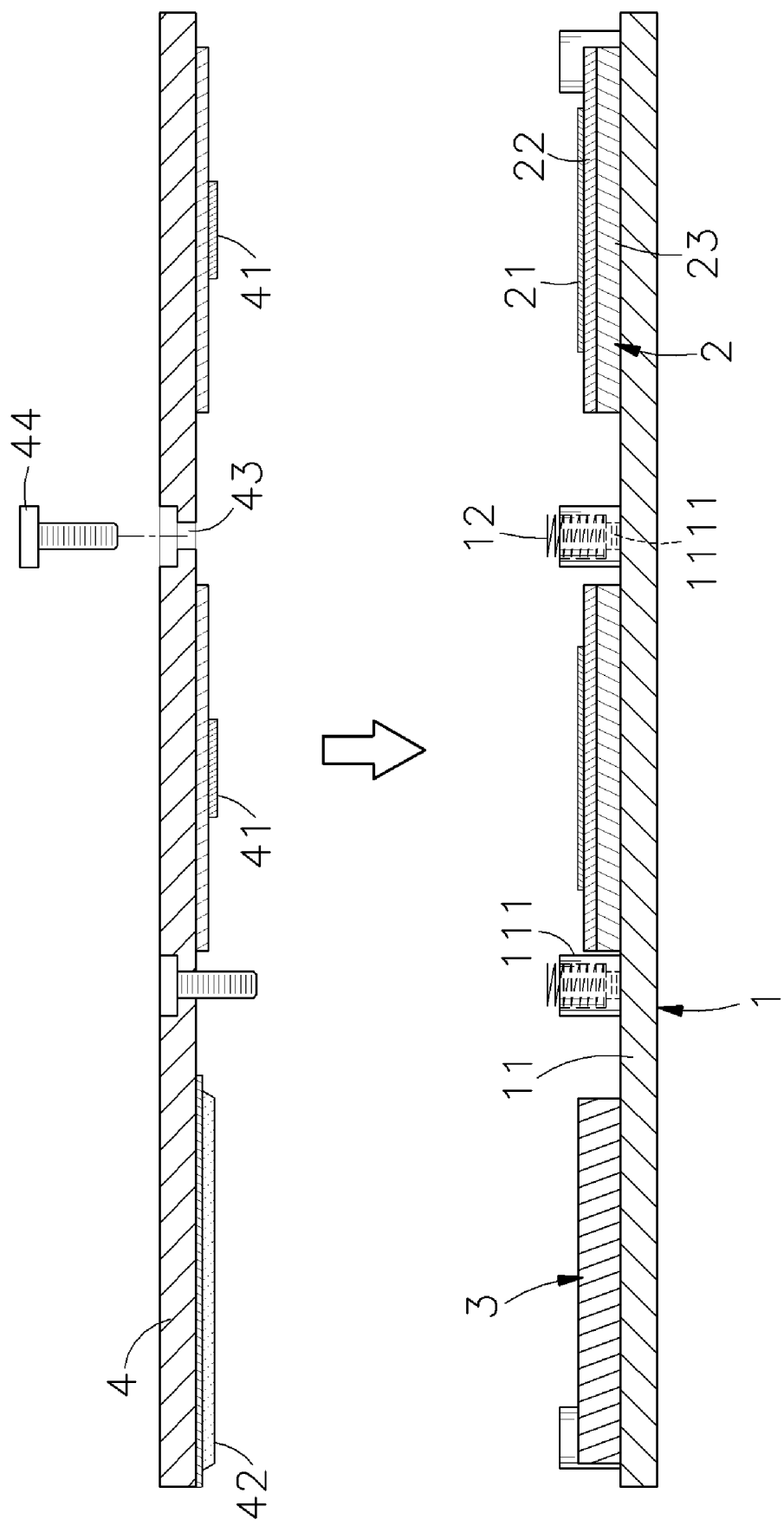
FIG. 3 is a sectional view showing installation of the stacked heat-transfer interface according to the present invention (I).
Figure 4:
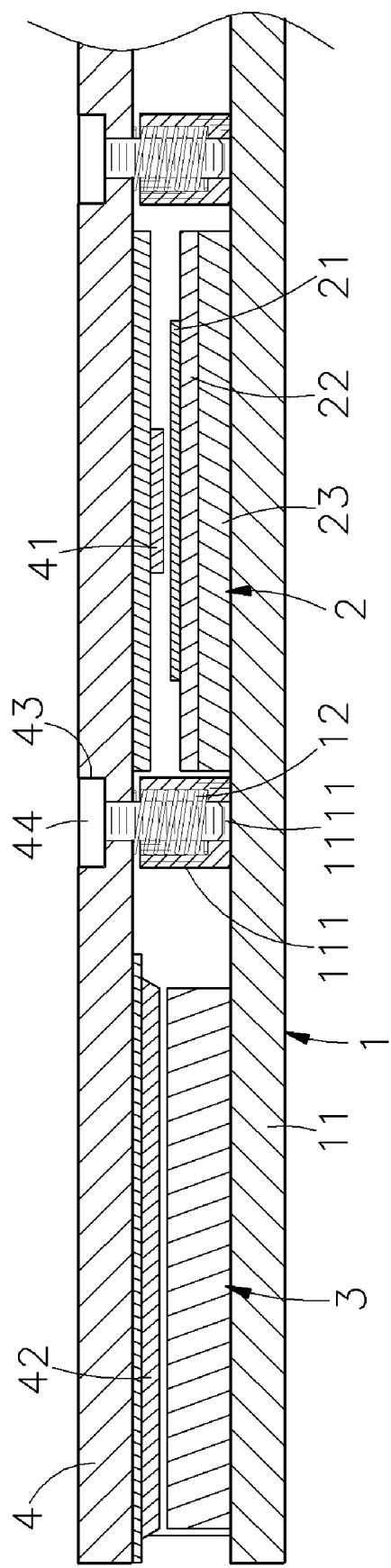
FIG. 4 is a sectional view showing installation of the stacked heat-transfer interface according to the present invention (II).

Referring to FIGS. 3 and 4 and FIGS. 1 and 2 again, during the assembly process of the present invention, the first heat-transfer sheet member 21 is adhered to the top surface of the heat-transfer block 22, and then the second heat-transfer sheet member 23 is adhered to the bottom surface of the heat-transfer block 22. After preparation of the first heat transfer devices 2, the first heat transfer devices 2 and the second heat transfer device 3 are respectively adhered to the top surface of the heat plate 11 of the heat dissipation module 1 corresponding to the first heat generating electronic devices 41 and second heat generating electronic device 42 of the circuit board 4 (see FIG. 2). Thereafter, the fastening members 44 are respectively inserted through the mounting holes 43 of the circuit board 4 and the elastic members 12 in the respective mounting holes 111 of the heat plate 11 and fastened up with the respective spiral fastening means 1111 to affix the circuit board 4 to the heat plate 11 of the heat dissipation module 1, keeping the first heat-transfer sheet members 21 of the first heat transfer devices 2 in close contact with the first heat generating electronic devices 41 and the second heat transfer device 3 in close contact with the second heat generating electronic devices 42. Further, when the first heat-transfer sheet members 21 of the first heat transfer devices 2 are attached to the respective first heat generating electronic devices 41, the second heat-transfer sheet members 23 of the first heat transfer devices 2 are elastically deformed to different extents to absorb different pressure subject to the height differences of the first heat generating electronic devices 41, thereby keeping the first heat-transfer sheet members 21 of the first heat transfer devices 2 in close contact with the respective first heat generating electronic devices 41.

When the heat transfer module 1 and the circuit board 4 are assembled for application, the heat plate 11 can be bonded to a metal shell for enabling the metal shell to dissipate heat energy from the heat transfer module 1 to the outside open air. Alternatively, a cooling fan can be used to cause currents of air toward the heat transfer module 1, thereby carrying heat away from the heat transfer module 1 rapidly.

Further, the aforesaid heat generating electronic devices 41 and 42 of the circuit board 4 can be IC chips, microprocessors, electronic transistors, semiconductor devices, or other electronic components that generate heat during operation.

As stated above, the stacked heat-transfer interface of the present invention has the follow benefits:

1. The high heat conductivity and low thermal resistance first heat-transfer sheet members 21 of the first heat transfer devices 2 are directly attached to the first heat generating electronic devices 41 of the circuit board 4 to transfer heat energy vertically from the first heat generating electronic devices 41 to the respective heat-transfer blocks 22, which, subject to its even heat distribution characteristic, distributes heat energy evenly to the second heat-transfer sheet members 23 that have a surface area equal to the associating heat-transfer block 22, enabling heat energy to be further transferred to the heat plate 11 for further dissipation. By means of the elastically deformable characteristic of the second heat-transfer sheet members 23 to absorb pressure from the first heat generating electronic devices 41 of the circuit board 4, the first heat transfer devices 2 compensate for the height tolerance of the first heat generating electronic devices 41, so that the first heat-transfer sheet members 21 of the first heat transfer devices 2 are kept in close contact with the respective first heat generating electronic devices 41 of the circuit board 4 for quick transfer of heat energy.

2. By means of the rapid and vertical heat transfer characteristic of the first heat-transfer sheet members 21 of the first heat transfer devices 2 and the horizontal and vertical heat spreading characteristic of the second heat-transfer sheet members 23 of the first heat transfer devices 2, heat energy is quickly transferred from the first heat generating electronic devices 41 of the circuit board 4 for further dissipation, preventing accumulation of heat energy in the first heat generating electronic devices 41 and avoiding generation of hot-spot to interfere with normal functioning of the first heat generating electronic devices 41 of the circuit board 4.

3. Because the second heat-transfer sheet members 23 of the first heat transfer devices 2 are elastically deformed to provide shock absorbing and buffering effects when the first heat-transfer sheet members 21 of the first heat transfer devices 2 are respectively attached to the first heat generating electronic devices 41 of the circuit board 4, the stacked heat-transfer interface 1 does not cause any stress damage to the first heat generating electronic devices 41 of the circuit board 4.

4. According to the present invention, an elastic member (for example, coil spring) 12 is mounted in each mounting hole 111 above the respective spiral fastening means 1111 of the heat plate 11. When the fastening members 44 are respectively inserted through the mounting holes 43 and the elastic members 12 in the respective mounting holes 111 of the heat plate 11 and fastened up with the respective spiral fastening means 1111 to secure the heat dissipation module 1 and the circuit board 4 together, the elastic members 12 buffer the applied fastening force, avoiding uneven load, and therefore the heat plate 11 can be smoothly attached to the inside surface of the metal case in which the heat transfer interface structure of the present invention is installed.

5. The stacked heat-transfer interface structure fits the arrangement of the circuit board 4. The second heat-transfer sheet members 23 of the first heat transfer devices 2 have different thicknesses to compensate for the height tolerances of the first heat generating electronic devices 41 of the circuit board 4, i.e., the first heat transfer devices 2 are differently configured to fit the respective first heat generating electronic devices 41 of the circuit board 4. By means of adhesion, the first heat-transfer sheet members 21, the heat-transfer blocks 22 and the second heat-transfer sheet member 23 are quickly assembled to constitute the desired first heat transfer devices 2.

Although a particular embodiment of the invention has been described in detail for purposes of illustration, various modifications and enhancements may be made without departing from the spirit and scope of the invention. For example, the number of the first and second heat transfer devices 2 and 3 and the number of the first heat generating electronic devices 41 of the circuit board 4 may be changed without departing from the spirit and scope of the invention. Accordingly, the invention is not to be limited except as by the appended claims.

What the invention claimed is:

1. A stacked heat-transfer interface structure comprising a circuit board carrying a plurality of heat generating electronic devices that have different heights, and a heat dissipation module, said heat dissipation module comprising a heat plate and at least one first heat transfer device and at least one second heat transfer device respectively mounted on said heat plate and respectively attached to said heat generating electronic devices of said circuit board for carrying heat away from said heat generating electronic devices of said circuit board, wherein:

each said first heat transfer device comprises a first heat-transfer sheet member disposed at a top side, a second heat-transfer sheet member disposed at a bottom side, and a heat-transfer block sandwiched between said first heat-transfer sheet member and said second heat-transfer sheet member, said first heat-transfer sheet member being made of a material having a high heat conductivity and a low thermal resistance and a vertical heat transfer characteristic, said first heat-transfer sheet member being directly bonded to one said heat generating electronic device of said circuit board, said heat-transfer block being made of a metal material having horizontal and vertical heat transfer characteristics for spreading heat energy from said first heat-transfer sheet member onto said second heat-transfer sheet member, said second heat-transfer sheet member being made of an elastic material having a low heat conductivity, a high thermal resistance, a vertical heat transfer characteristic and a thickness greater than said first heat-transfer sheet member such that when said first heat-transfer sheet member is attached to the respective heat generating electronic device of said circuit board, said second heat-transfer sheet member is elastically deformed to compensate for the height difference of the respective heat generating electronic device relative to the other heat generating electronic devices of said circuit board for transferring heat energy vertically to said heat plate for dissipation;

each said second heat transfer device is mounted on said heat plate of said heat dissipation module, having a thickness greater than said at least one first heat transfer device;

the heat generating electronic devices of said circuit board include at least one first heat generating electronic device respectively attached to the at least one first heat transfer device of said heat dissipation module and at least one second heat generating electronic device respectively attached to the at least one second heat transfer device of said heat dissipation module, said at least one second heat generating electronic device having a lower heat generating effect relative to said first heat generating electronic device.

2. The stacked heat-transfer interface structure as claimed in claim 1, wherein said first heat-transfer sheet member has a thickness about 0.2~0.3 mm.

3. The stacked heat-transfer interface structure as claimed in claim 1, wherein said first heat-transfer sheet member has a heat conductivity about 10-18 w/m° K (watt per meter Kelvin).

4. The stacked heat-transfer interface structure as claimed in claim 1, wherein said second heat-transfer sheet member has a thickness about 0.8~4 mm.

5. The stacked heat-transfer interface structure as claimed in claim 1, wherein said second heat-transfer sheet member has a heat conductivity about 1-6 w/m° K (watt per meter Kelvin).

6. The stacked heat-transfer interface structure as claimed in claim 1, wherein said heat-transfer block has a cross sectional area greater than said first heat-transfer sheet member, and is selected from one of the material group of aluminum, copper and their alloys.

7. The stacked heat-transfer interface structure as claimed in claim 1, wherein said heat-transfer block has a cross sectional area equal to the surface area of said second heat-transfer sheet member.

8. The stacked heat-transfer interface structure as claimed in claim 1, wherein said heat plate is selected from one of the material group of aluminum, copper and their alloys.

9. The stacked heat-transfer interface structure as claimed in claim 1, wherein said heat plate comprises a plurality of mounting holes; said circuit board comprises a plurality of mounting holes and a plurality of fastening members respectively mounted in the mounting holes of said circuit board and the mounting holes of said heat plate to secure said circuit board and said heat dissipation module together.

10. The stacked heat-transfer interface structure as claimed in claim 1, wherein said heat dissipation module further comprises a plurality of elastic members respectively mounted in the mounting holes of said heat plate and sleeved onto said fastening members and stopped between said heat plate and said circuit board to buffer the pressure between heat plate and said circuit board.

11. The stacked heat-transfer interface structure as claimed in claim 1, wherein said heat plate is bonded to an external metal shell for dissipating heat energy through said external metal shell.

12. The stacked heat-transfer interface structure as claimed in claim 1, wherein said heat plate is used with a fan that causes currents of air toward said heat plate to carry heat away from said heat plate.

13. The stacked heat-transfer interface structure as claimed in claim 1, wherein said heat generating electronic devices of said circuit board include at least one IC chip, one microprocessor, transistor and one semiconductor device.

* * * * *